United States Patent [19]

Dimeff

[11] Patent Number: 4,490,686
[45] Date of Patent: Dec. 25, 1984

[54] DIFFERENTIAL AMPLIFIER WITH COMMON MODE REJECTION MEANS

[75] Inventor: John Dimeff, San Jose, Calif.

[73] Assignee: Mark Telephone Products, Inc., Sunnyvale, Calif.

[21] Appl. No.: 394,991

[22] Filed: Jul. 2, 1982

[51] Int. Cl.³ .............................. H03F 3/45; H03F 1/26
[52] U.S. Cl. ....................................... 330/258; 330/149
[58] Field of Search ............... 330/146, 149, 252, 258, 330/293, 260

[56] References Cited

FOREIGN PATENT DOCUMENTS 131607 7/1978 Fed. Rep. of Germany ...... 330/258
23609 2/1980 Japan ................................... 330/260

Primary Examiner—James B. Mullins
Assistant Examiner—G. Wan
Attorney, Agent, or Firm—Townsend and Townsend

[57] ABSTRACT

A differential amplifier suitable for use with a transducer network, such as a Wheatstone bridge, for measuring small signal voltages while eliminating common mode voltage contributions applied to the input of the amplifier. A potentiometer is connected across the output terminals of a pair of amplifiers whose positive input terminals receive the common mode voltage components and induced signal voltages from the transducer network. The shiftable terminal of the potentiometer is connected to the negative input terminals of one of the two amplifiers and adjusted to control the gain of the amplifier pair. The output signals of the differential amplifier are proportional to the induced signal voltages and devoid of the common mode voltage.

10 Claims, 2 Drawing Figures

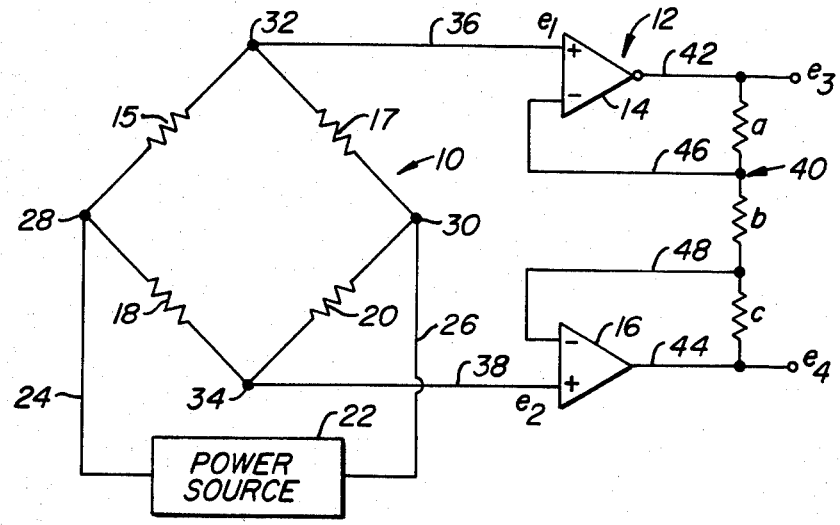
FIG._1. (PRIOR ART)
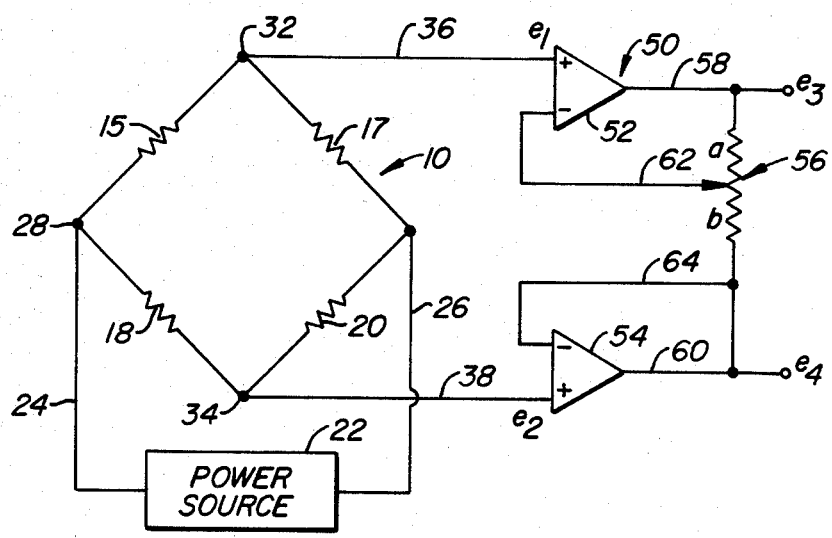
FIG._2.

DIFFERENTIAL AMPLIFIER WITH COMMON MODE REJECTION MEANS

BACKGROUND OF THE INVENTION

In the normal application of a Wheatstone bridge, an applied power voltage is supplied to one power input terminal of the bridge while the other power input terminal is grounded. The portion of the power voltage appearing at the output terminals of the bridge is also known as a common mode voltage. One or more legs of the bridge will generally be formed of electrical transducers, such as variable resistances which vary in response to applied signals, such as signals due to changes in pressure or temperature. The bridge will typically have two values of voltage appearing at the output terminals thereof. At one output terminal, there will be one-half of the power voltage, or the common mode voltage, plus the induced signal voltage due to variations in the transducers of the bridge. At the other output terminal, there will be one-half of the common mode voltage minus the induced signal voltage. The output terminals of the bridge are typically connected to a differential amplifier to measure the induced signal voltage.

The objective of any differential amplifier is to amplify the induced signal voltage without being influenced by the common mode components. If the output terminals of the bridge are applied to the input terminals of two separate amplifiers defining the differential amplifier, the response of those two amplifiers to the relatively large common mode or power voltage components, for example, 5 volts, must be exactly the same so that the common mode components will cancel each other at the outputs of the two amplifiers. If the voltage outputs of the two amplifiers differs slightly, that is, if a gain of one of the amplifiers is, for example, a percent or two different from the gain of the other amplifier, there will then be a contribution to the output voltage of the differential amplifier of 1% or more of the relatively large common mode voltage. This contribution could be 50 millivolts for a common mode voltage of 5 volts.

A typical signal voltage of a Wheatstone bridge is 100 millivolts. If one is concerned with measuring such a signal voltage with the precision of 1 part in 1,000, then one is concerned with a one-tenth of a millivolt. Thus, it is obvious then that a 50 millivolt contribution to the amplifier output that might result due to the unequal amplification by the two amplifiers would be 500 times the error which one is willing to accept. It is important, therefore, that the two amplifiers arranged to cancel this common mode voltage contribution.

In a typical differential amplifier for the output terminals of a Wheatstone bridge are connected to the positive input terminals of a differential amplifier comprised of two amplifiers and a resistance network of three resistances in series across the outputs of the two amplifiers. Return leads are coupled on respective sides of the center resistance and are connected to the negative input terminals of the two amplifiers. In order for the common mode voltage to be totally absent from the output of the differential amplifier, the other two resistances of the network must be exactly the same in resistance value and must remain so with aging, temperature changes, mechanical stresses and other factors which influence their value. This is a difficult requirement to meet and maintain over extended periods of usage of the differential amplifier. Because of this drawback, a need has arisen for an improved differential amplifier which clearly avoids the aforesaid problems yet provides a reliable signal voltage output substantially devoid of any contribution due to a common mode voltage.

SUMMARY OF THE INVENTION

The present invention satisfies the aforesaid need by providing a differential amplifier for use with a Wheatstone bridge or other transducer device for measuring signal voltages wherein the signal measured at the output of the differential amplifier has no contributions due to the common mode or power voltage applied to the bridge or to the alternate transducer whose signal is to be amplified. In this way, measurements of signals at the output of the differential amplifier are highly reliable so that the differential amplifier is suitable for a wide variety of applications, especially those involving Wheatstone bridges measuring pressure, temperature, and other variable parameters of a system.

The present invention includes a pair of amplifiers and a potentiometer across the outputs of the amplifiers. A first return lead is connected between the shiftable terminal of the potentiometer and the negative input of one of the amplifiers, while a second return lead is coupled to one side of the potentiometer and to the negative input terminal of the other amplifier. The potentiometer operates to adjust the ratio of the resistance of the two parts of the potentiometer on opposite sides of the shiftable terminal thereof so that such ratio determines the gain of one of the amplifiers. The second amplifier accepts the output of the other bridge terminal, and operates as a unity gain buffer, providing that bridge output as a reference to the first amplifier, so that the signal to the first amplifier is measured with respect to the opposing bridge output. Thus only differences in the voltage output will be amplified and will appear as differences in the outputs of the two amplifiers. Common mode signals will thus be entirely eliminated. Further, since the gain of the system is dependent only on the ratio of the two parts of the potentiometer, it will be highly stable. This is because both parts of the potentiometer are made of adjacent sections of a resistance wire or of a composite material that is identical and made from the same batch of material in the same manufacturing process. Thus, since the two parts of the potentiometer will track in the same manner and the relative value of the two parts will be highly stable, the gain remains stable. Even if the two parts do not track in the same manner, it would not cause the introduction of any common mode voltage component in the output voltage of the differential amplifier. It would only change the gain of the amplifiers very slightly and would not alter the common mode rejection. Thus, the present invention avoids the problems associated above with respect to prior art differential amplifiers.

The primary object of the present invention is to provide an improved differential amplifier for use with a Wheatstone bridge or other transducer device wherein the differential amplifier operates to reject or eliminate the contribution of the common mode or power voltage applied to the bridge or transducer device, and to provide a differential amplifier whose gain remains uniformly stable over long periods of time so that precision measurements can be readily made without continued calibration and other steps to assure that the signal is highly reliable.

Another object of the present invention is to provide a differential amplifier of the type described wherein the amplifier itself is comprised of two amplifiers which have a potentiometer across the signal outputs of the amplifiers so that the potentiometer itself can control the gains of the two amplifiers in such a way that the gains of the same will remain substantially constant notwithstanding the fact that the potentiometer will change due to aging, temperature, mechanical stresses and other factors over time.

Other objects of this invention will become apparent as the following specification progresses, reference being had to the accompanying drawings for an illustration of a preferred embodiment of the invention.

In the Drawings:

FIG. 1 is a differential amplifier of the prior art for use with a Wheatstone bridge; and FIG. 2 is a view similar to FIG. 1 but showing the differential amplifier of the present invention as used at the output of a Wheatstone bridge.

The teachings of the present invention as shown in FIG. 2 are to be contrasted with a conventional differential amplifier shown in FIG. 1 which is used in connection with a Wheatstone bridge 10, the differential amplifier being denoted by the numeral 12 and being formed by two amplifiers 14 and 16. Bridge 10 is provided with four legs 15, 17, 18 and 20 which are transducers which, for purposes of illustration, are shown as resistances. A power source 22 supplies a power voltage by way of leads 24 and 26 to the input terminals 28 and 30, respectively, of the bridge.

The output terminals 32 and 34 of the bridge are coupled by leads 36 and 38, respectively, to the positive input terminals of respective amplifiers 14 and 16 forming parts of differential amplifier 12. A resistance network 40 is across the output leads 42 and 44 of amplifiers 14 and 16 respectively. The resistance network is made up of three resistances denoted by the letters a, b, and c. Leads 46 and 48 are connected in the manner shown in FIG. 1 between the negative input terminals of respective amplifiers 14 and 16 and the resistance network 40, lead 46 being at the junction of resistances a and b and lead 48 being at the junction of resistances b and c.

If the voltage components applied from bridge 10 to the positive input terminals of amplifiers 14 and 16 are denoted by the symbols $e_1$ and $e_2$, respectively, and if the output voltages of the two amplifiers 14 and 16 are denoted as $e_3$ and $e_4$, then the output voltages can be derived as functions of the components $e_1$ and $e_2$ and the resistances a, b, and c as follows:

$$e_3 = e_1 \frac{a+b+c}{b+c} - e_2 \frac{a}{b} \quad (1)$$

$$e_4 = -e_1 \frac{c}{b} + e_2 \frac{a+b+c}{a+b} \quad (2)$$

The difference between $e_3$ and $e_4$ is then given as follows:

$$e_3 - e_4 = e_1 \left( \frac{a+b+c}{b+c} + \frac{c}{b} \right) - e_2 \left( \frac{a}{b} + \frac{a+b+c}{a+b} \right) \quad (3)$$

For true differential gain, the term of the right-hand side of this latter equation must contain equal multipliers for the terms $e_1$ and $e_2$. That is, $$\frac{c}{b} + \frac{a+b+c}{b+c} = \frac{a+b+c}{a+b} + \frac{a}{b} \quad (4)$$

Thus, c must exactly equal a for true differential gain, and in such a case, equation (3) becomes:

$$e_3 - e_4 = (e_1 - e_2)\left( \frac{2a+b}{a+b} + \frac{a}{b} \right) \quad (5)$$

From a review of equation (5), it is clear that the differential output voltage of differential amplifier 12 can only provide a true differential gain when resistance "a" equals resistance "c" and this equality must exist with aging of the resistances, with temperature changes and mechanical stresses thereon, and with other factors which can influence the output voltage of the differential amplifier. Since these resistances a and c are individual components, they cannot be selected to provide an exact match. Since they are not necessarily made from the same batch of resistance material and are not treated in substantially the same way during manufacture, they will tend to track differently and have different characteristics. In general, therefore, these two resistances a and c will not be equal to each other so that the gains of the two amplifiers 14 and 16 will not be the same. As a result, the output voltages $e_3$ and $e_4$ will be functions both the signal voltages and the common mode voltages contained in $e_1$ and $e_2$ as set forth in equation (3) above. The unwanted contribution of a common mode component to the outputs of the two amplifiers 14 and 16 results in unreliable output measurements, especially in view of the very small signals that are generated by bridge 10.

In the practice of the present invention, a differential amplifier 50 which is used with bridge 10 has the same or substantially similar transducers in the legs as in the FIG. 1 prior art embodiment to illustrate the invention. Differential amplifier 50 includes two amplifiers 52 and 54 and a potentiometer 56 having one end coupled to a lead 58 and another end coupled to lead 60. The shiftable terminal 62 of potentiometer 56 is coupled to the negative input terminal of amplifier 52 and a lead 64 couples the lead 60 with the negative input terminal of amplifier 54.

The output voltages $e_3$ and $e_4$ for differential amplifier 50 are given by the following:

$$e_3 = e_1 \frac{a+b}{b} - e_2 \frac{a}{b} \quad (6)$$

$$e_4 = e_2$$

From equation (6), the difference equation can be obtained and written as follows:

$$e_3 - e_4 = (e_1 - e_2) \frac{a+b}{b} \quad (7)$$

It can be seen in equation (7) that components $e_1$ and $e_2$ are of opposing sign and multiplied by the same factor. Differences between $e_1$ and $e_2$ will be amplified; whereas, similarities or common mode voltage signals will cancel each other. This rejection of common mode voltage will occur regardless of the value of the resistance "a" on one side of terminal 62 and the resistance, "b" on the opposite side of terminal 62, resistances a and b being parts of potentiometer 56. Thus, there is no contribution in the output of differential amplifier 50 from the common mode voltage components partly comprising $e_1$ and $e_2$. Moreover, because both parts a and b of the potentiometer are made out of adjacent sections of the same resistance wire or are of the same composite material that is made from the same material batch and is treated in the same way, parts a and b will track together and stability of potentiometer 56 will be relatively high. However, even if parts a and b did not track together, it would not cause the introduction of any common mode voltage because the common mode voltage components of $e_1$ and $e_2$ cancel each other as shown in equation (7). This is in direct contrast with the fact that the normal differential amplifier as shown in FIG. 1 requires the balancing of two separate and independent resistances a and b as shown in FIG. 1.

Potentiometer 56 is adjustable to adjust the ratio of parts a to b thereof and this ratio determines the gain of the system. Thus, by making the adjustment, one can arrive at a particular gain for a particular output signal for an imposed stimulus to the transducers in bridge 10. Thus, the present invention provides a simple differential amplifier which can be readily adjusted to provide highly reliable output measurements by a mere substitution of a potentiometer for the resistance network of prior art differential amplifiers. Where adjustment is not required, fixed resistances can be substituted for parts a and b of the potentiometer 56. This circuit will retain the advantage of high rejection to common mode signals, but will suffer from slight variations in gain as outlined above.

What is claimed is:

1. A differential amplifier for use with a transducer network having a common mode voltage applied thereto, comprising: an amplifier having a pair of positive input terminals, a pair of negative input terminals, and a pair of output terminals, the positive input terminals of the amplifier adapted to be coupled to the transducer network for receiving respective signal and common mode voltage components from the network; and a potentiometer having respective end terminals coupled across the output terminals of the amplifier, a shiftable element coupled to one of the negative input terminals, and one of the end terminals coupled to the other of the negative input terminals for producing a first voltage at a one of the pair of output terminals and a second voltage at the other of the pair of output terminals, the difference of said first and second voltages forming an output voltage of the amplifier that has the common mode voltage components removed therefrom.

2. The differential amplifier as set forth in claim 1, wherein said amplifier comprises a pair of difference amplifiers each having a positive input, a negative input, and an output respectively coupled to a corresponding one of the positive input terminals, the negative input terminals, and the output terminals.

3. The differential amplifier as set forth in claim 2, wherein the amplification of the other of the amplifiers is substantially unity.

4. The differential amplifier as set forth in claim 2, wherein the amplification of the one of the amplifiers is greater than unity.

5. The differential amplifier as set forth in claim 4, wherein the amplification of the other of the amplifiers is substantially unity.

6. The differential amplifier as set forth in claim 5, wherein the amplification of the other of the amplifiers is substantially unity.

7. A differential amplifier for use with a transducer network to receive a signal voltage containing a common mode voltage, the differential amplifier being operable to amplify the signal voltage and cancel the common mode voltage, the differential amplifier comprising: a pair of amplifiers, each amplifier having a positive input terminal, a negative input terminal, and an output terminal, the positive transducer network for receiving respective signal and common mode voltage components from the network; and a potentiometer having end terminals coupled across the output terminals of the amplifiers and a shiftable terminal coupled to the negative input terminal of one of the amplifiers, and one of the end terminals being coupled to the negative input terminal of the other of the amplifiers, the output terminals of the pair of amplifiers each providing thereat an output voltage, the difference of which forms an output signal voltage having the common mode voltage cancelled therefrom.

8. A differential amplifier as set forth in claim 7, wherein the negative input terminal of the other amplifier being coupled to the output terminal of the other amplifier.

9. The differential amplifier as set forth in claim 7, wherein the amplification of the one of the amplifiers is greater than unity.

10. The differential amplifier as set forth in claim 7, wherein the amplification of the other of the amplifiers is substantially unity.

* * * * *